United States Patent [19]
Hobson

[11] Patent Number: 5,096,852
[45] Date of Patent: Mar. 17, 1992

[54] METHOD OF MAKING PLASTIC ENCAPSULATED MULTICHIP HYBRID INTEGRATED CIRCUITS

[75] Inventor: Larry D. Hobson, Tucson, Ariz.

[73] Assignee: Burr-Brown Corporation, Tucson, Ariz.

[21] Appl. No.: 476,511

[22] Filed: Feb. 7, 1990

Related U.S. Application Data

[62] Division of Ser. No. 201,589, Jun. 2, 1988, abandoned.

[51] Int. Cl.$^5$ .................. H01L 21/56; H01L 21/58; H01L 21/60
[52] U.S. Cl. .................................... 437/207; 437/220
[58] Field of Search ..................... 437/206, 220, 207

[56] References Cited

U.S. PATENT DOCUMENTS

| | | | |
|---|---|---|---|
| 3,131,476 | 5/1964 | Seher | 51/235X |
| 3,542,266 | 11/1970 | Woelfle, R. | 225/2 |
| 3,544,857 | 12/1970 | Byrne et al. | 317/234 |
| 4,084,354 | 4/1978 | Grandia et al. | 51/327X |
| 4,138,304 | 2/1979 | Gantley | 51/283X |
| 4,506,238 | 3/1985 | Endoh et al. | 333/138 |
| 4,696,526 | 9/1987 | Newton et al. | 439/68 |
| 4,780,795 | 10/1988 | Meinel | 361/402 |
| 4,783,141 | 11/1988 | Baba et al. | 350/167 |
| 4,951,291 | 8/1990 | Miyauchi et al. | 372/49 |

FOREIGN PATENT DOCUMENTS

| | | | |
|---|---|---|---|
| 140465 | 10/1979 | Japan . | |
| 141562 | 11/1979 | Japan . | |
| 46561 | 4/1980 | Japan . | |
| 9147 | 1/1985 | Japan . | |
| 60-41249 | 3/1985 | Japan . | |
| 79753 | 5/1985 | Japan . | |
| 160134 | 8/1985 | Japan . | |
| 160154 | 8/1985 | Japan . | |
| 61-148859 | 7/1986 | Japan | 437/51 |
| 272956 | 12/1986 | Japan . | |
| 557091 | 12/1974 | Switzerland . | |
| 327310 | 9/1989 | EPO . | |
| WO90/09688 | 8/1990 | PCT . | |

OTHER PUBLICATIONS

"PLASTIC DUAL-IN-LINE FILM MODULE", by L. V. Auletta, IBM Technical Disclosure Bulletin, vol. 17, No. 7, Dec. 1974, p. 1893.

Primary Examiner—Olik Chaudhuri
Assistant Examiner—David E. Graybill
Attorney, Agent, or Firm—Cahill, Sutton & Thomas

[57] ABSTRACT

A method of making a hybrid integrated circuit includes bonding an insulative film to a first area of a lead frame flag, a second area of the lead frame flag being exposed. A plurality of individual metalized strips and a first flag area are formed on the film. A first integrated circuit chip such as a low power MOS chip, is bonded to the first flag area, and a second integrated circuit chip, such as a high power bipolar chip, is bonded to the second area of the lead frame flag. Bonding wires are bonded to connect various bonding pads and fingers of the lead frame of the two integrated circuit chips to various metallized strips on the insulative film. The chips, bonding wires, lead frame flag, lead frame fingers, and insulative film are encapsulated in plastic by transfer molding.

2 Claims, 2 Drawing Sheets

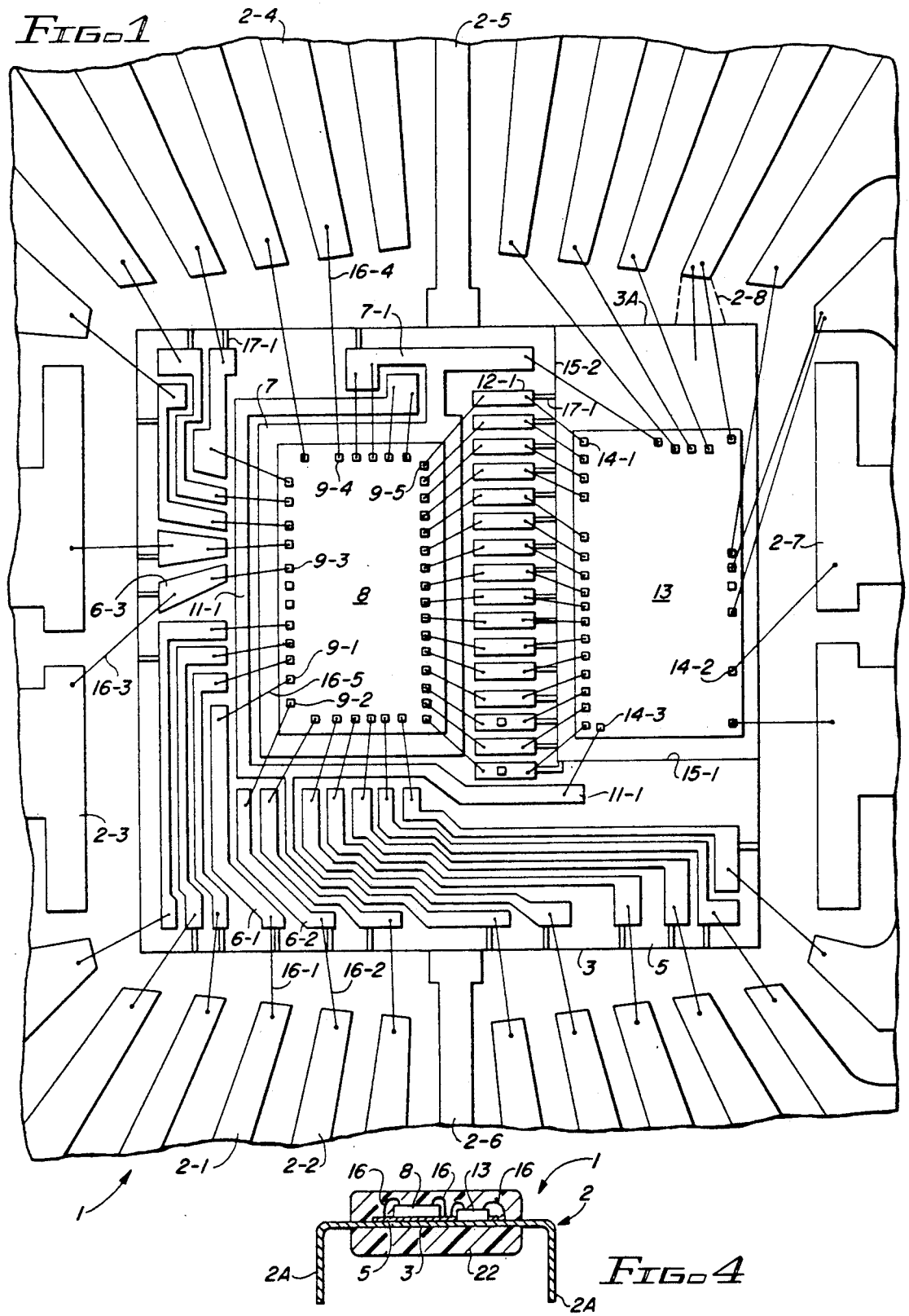

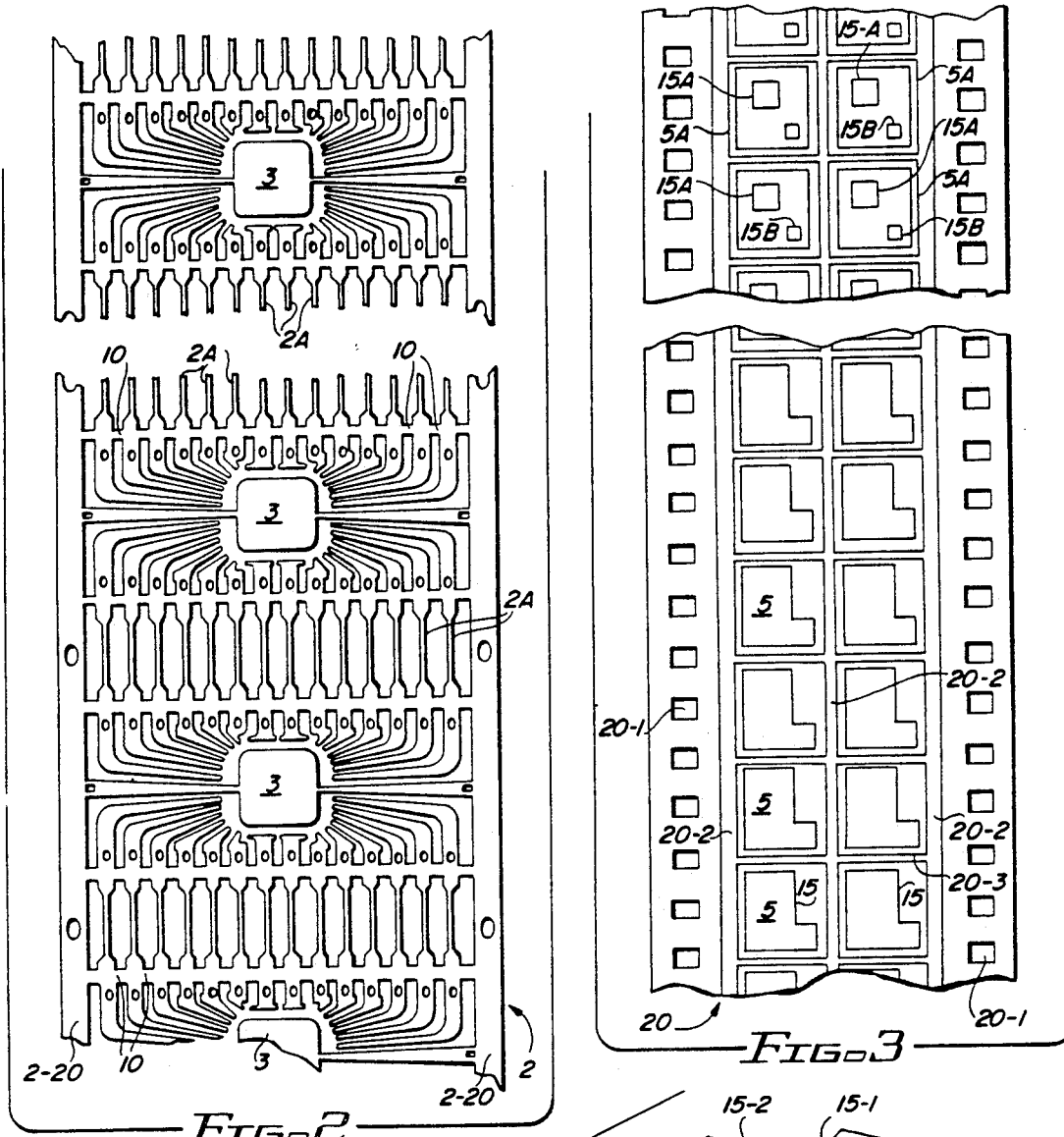
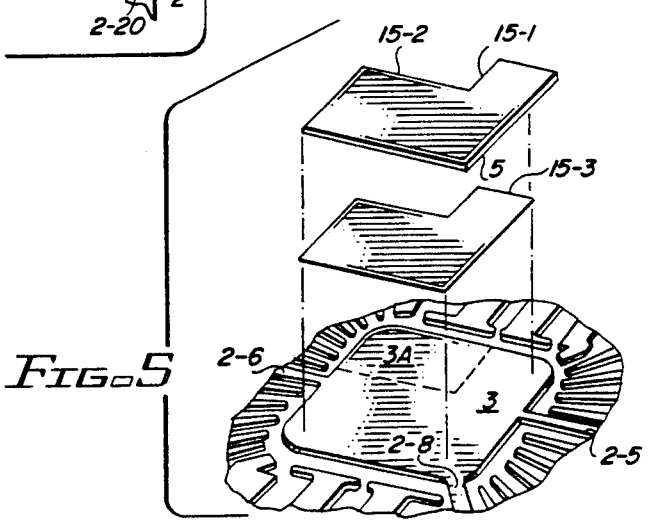

METHOD OF MAKING PLASTIC ENCAPSULATED MULTICHIP HYBRID INTEGRATED CIRCUITS

This is a division of application Ser. No. 201,589, filed June 2, 1988, now abandoned

BACKGROUND OF THE INVENTION

The invention relates to plastic encapsulated multichip hybrid integrated circuit structures, particularly those suitable for a combination of high power chips and low power chips, and to methods for manufacturing such plastic encapsulated multichip hybrid integrated circuits.

Hybrid integrated circuits have been widely manufactured for many years to provide, in a single package, electronic devices that are too complex to be economically integrated on a single monolithic semiconductor chip. In hybrid integrated circuits, various monolithic integrated circuit chips, capacitors, film resistors, and other components are die bonded, deposited, or otherwise attached to a ceramic substrate. The ceramic substrate has thereon a suitable metal interconnection pattern including "flag" areas (onto which integrated circuit chips and other components are bonded) and also including metal interconnect strips ("interconnects") to which bonding pads of the various components are electrically connected by wire bonding techniques. External leads of a hybrid integrated circuit package are electrically connected to the ceramic substrate in various ways. Until recently, hybrid integrated circuits generally were quite expensive. It has been believed that the market for hybrid integrated circuits could be greatly expanded if the costs of hybrid integrated circuit assembly and encapsulation techniques could be substantially lowered. To this end, multiple integrated circuit chips have been provided by bonding them to a metalization pattern on a thin insulating layer formed as part of a flexible ribbon substrate attached to a conventional lead frame. Bonding pads of the various integrated circuit chips and other components have been wire bonded to metal strips or interconnects on the insulating layer and to fingers of the lead frame. The assembly has been encapsulated in plastic by a plastic transfer molding process. This technique is disclosed in Japanese Patent Public Disclosure No. 60-41249, dated Mar. 4, 1985, assigned to NIPPON DENKI K. K. The technology disclosed in that reference provides lower cost, complex hybrid integrated circuits, but is subject to the limitation that the integrated circuit chips therein must dissipate only relatively low amounts of power. This is necessary because flexible ribbon-type materials that are good electrical insulators are relatively poor thermal conductors. Since the etched copper technology requires gold electroplated interconnects, widespread use of vias and connections of the vias to inner, isolated interconnects are necessary to provide connection of isolated interconnects to a "plating bus". These vias and connections thereto add expense, and also degrade electrical performance, as subsequently explained. Therefore, if high power, high speed, low noise, low cost bipolar integrated circuit chips or other high power discrete or integrated circuit chips all are required to implement a desired hybrid integrated circuit, the structure and technique disclosed in the above Japanese reference is inadequate and impractical.

As those skilled in the art know, if a hybrid integrated circuit is to be encapsulated in plastic using a plastic transfer molding process, the flow of plastic produces substantial stress on chip-to-chip wire bonds and on chip-to-lead-frame wire bonds. This makes it almost essential to use gold bonding wire in plastic encapsulated integrated circuits, since the more ductile characteristics of the gold bonding wires enable it to withstand the flow of plastic during the transfer molding process. However, chip-to-chip wire bonding is very difficult to accomplish using gold bonding wire. Usually, chip-to-chip bonds require a "wedge bond", rather than a "capillary bond". Wedge bonds are more adaptable to aluminum rather than gold wire. When capillary bonding techniques are used, short, isolated metal strips or "interconnects" usually are required.

An example of a hybrid integrated circuit that would be very difficult to provide in a plastic package using the prior technology disclosed in Japanese Patent Public Disclosure No. 60-41249 is a digital to analog converter including a relatively low power CMOS integrated circuit chip containing digital logic circuitry and switching circuitry and a relatively high power bipolar integrated circuit chip containing an analog amplifier and bit current switch circuits. Up to now, such a hybrid integrated circuit digital to analog converter encapsulated in plastic could be provided only by die bonding both the CMOS chip and the bipolar chip onto a multilayer polymer film substrate attached to a lead frame. The latter approach is more costly than desired, and results in a lower level of circuit performance than is desirable, either because of 1) the high parasitic capacitance associated with the vias and connections thereto and/or 2) lower operating speeds than might otherwise be achieved since the chip power dissipation is limited by the high thermal resistance of the polymer film, and speed often is limited by the amount of power dissipation that can be allowed.

It would be desirable to provide a much lower cost multichip hybrid integrated circuit including both high power chips (such as bipolar integrated circuit chips) and high density, low power integrated circuit chips (such as integrated circuit CMOS logic chips) in a single, low cost, plastic-encapsulated hybrid integrated circuit package.

Some prior multichip plastic encapsulated integrated circuits which include a plurality of integrated circuit chips are die bonded onto conductive flags formed on a plastic substrate. Manufacture of such substrates has included provision of vias (i.e. feedthroughs) extending through the plastic substrate to metal "plating bus" conductors on the bottom surface of the plastic substrate to enable all conductors, (including "interior" interconnects entirely surrounded by other conductors) on the top surface to be electrically shorted to a plating bus to which an electroplating voltage is applied during gold electroplating. The vias and connections thereto add to the expense of manufacture, as they require substantial additional surface area and complicate the interconnect routing. When the insulative substrate with the electroplated conductors thereon is punched out of the ribbon substrate, the interconnects are severed from the plating bus. The vias and the additional conductors connected thereto (on the bottom side of the substrate) cause additional capacitive loading on various circuit nodes, slowing electrical circuit operation. The extra conductive lines connected to the vias also may produce undesired electrical coupling and noise pickup. If vias are not used, additional "temporary" shorting bars are required to connect each interconnect to the plating bus. Such shorting bars must be removed by machining a groove in the surface of the insulative film after the electroplating process. This groove then must be bridged by additional wire bonds, increasing overall costs.

SUMMARY OF THE INVENTION

Accordingly, it is an object of the invention to provide a method of manufacture of a low cost plastic encapsulated hybrid integrated circuit.

It is another object of the invention to provide an improved technique for manufacturing low cost plastic encapsulated hybrid circuits containing multiple monolithic integrated circuit chips mounted directly to the lead frame flag and interconnected by interconnect conductors on insulative film.

Briefly described, and in accordance with one embodiment thereof, the invention provides a method for making hybrid integrated circuit including an insulative film bonded to a first area of a lead frame flag, a second area of the lead frame flag being exposed. A plurality of individual metalized strips or interconnects are formed on the insulative film. A first chip is bonded directly to the second area of the lead frame flag. Bonding wires are bonded to electrically connect the first chip to various metalized strips. Other bonding wires are bonded to connect the metalized strips to various fingers of the lead frame. The first chip, the bonding wires, the lead frame flag, the lead frame fingers, and the insulative film all are encapsulated in plastic formed by transfer molding. An isolated flag area is included in the metalized pattern formed on the insulative film. A second chip is bonded to the isolated flag area, and bonding pads of the second integrated circuit chip are connected by bonding wires to various metalized strips, which are connected by other wire bonds to the fingers of the lead frame or to various bonding pads of the first chip. In the described embodiment of the invention, a plating bus is formed on the insulative film and is connected to the individual metalized strips and the isolated flag. Initially, a metal layer pattern including the individual bonding strips and the isolated flag are composed of copper foil backing adherent to the insulative film. The insulative film initially is included in a flexible copper-clad glass epoxy tape in the form of a ribbon having a plurality of sprocket holes disposed along opposite edges, respectively, so the ribbon can be formed into a roll and advanced by a sprocketed spool in an automated process. Gold is electroplated onto the copper while applying an electroplating voltage to the plating bus. The piece of the film to be bonded to the first area of the lead frame flag is punched out of a larger piece of film so that none of the plating bus is on the punched out film, but the metalized strips or interconnects and the first flag area are on the punched out piece.

BRIEF DESCRIPTION OF THE DRAWINGS

FIG. 1 is a partial plan view of the hybrid integrated circuit of the present invention prior to plastic encapsulation.

FIG. 2 is a plan view of a lead frame utilized in manufacture of the hybrid integrated circuit shown in FIG. 1.

FIG. 3 is a partial plan view of a flexible insulative ribbon tape from which a plurality of the insulative film substrates, with separate gold plated metal areas formed thereon, are subsequently punched.

FIG. 4 is a section view of the device in FIG. 1 after plastic encapsulation.

FIG. 5 is a partial perspective exploded view of the hybrid integrated circuit of FIG. 1.

DETAILED DESCRIPTION OF THE PREFERRED EMBODIMENTS

Referring now to FIGS. 1, 2, 4, and 5, immediately prior to plastic encapsulation (by well known transfer molding operations), hybrid integrated circuit 1 includes a lead frame generally designated by reference numeral 2 having a plurality of coplanar fingers such as 2-1, 2-2, 2-3, 2-4, 2-5, and 2-7. Each of the fingers is connected to a respective lead 2A. In the final structure, the temporary lead-to-lead shorting bars 10 (referred to as "dam bars"), are severed as the individual lead frames are punched out of the lead frame ribbon structure (FIG. 2), in accordance with conventional practice.

Two coplanar tie bars 2-5 and 2-6 support a thermally conductive lead frame flag 3, as best seen in FIG. 5. Lead frame flag 3 is spaced from the inner ends of all of the lead frame fingers 2-1, 2-1, etc. A direct connection such as 2-8 from a lead frame finger to lead frame flag 3 may be provided to apply a back voltage, as shown in FIGS. 1 and 5.

As best seen in FIG. 5, a thin 5.5 mil thick layer of glass epoxy film material formed as an L-shaped insulative substrate 5 is directly bonded to the upper surface of lead frame flag 3 by means of a pre-attached epoxy preform 15-3. The glass epoxy film can be "FR4" material, available with separate gold plated copper foil strips on the upper surface according to the user's specifications, manufactured by IBIDEN Co., Ltd., 300 AO YANAGI-CHO, OGAKI, GIFU 503, JAPAN, and available from IBIDEN USA CORP., of 2727 Walch Avenue, #203, Santa Clara, Calif. IBIDEN also supplies such glass epoxy film with a "B" staged epoxy material attached thereto, so a preattached preform is already on the substrate 5 when it is punched out of the glass epoxy film.

The gold plated pattern of metal strips on insulative substrate 5 includes a plurality of spaced individual metal interconnects such as 6-1, 6-2, 6-3, etc. A relatively large area gold plated conductive "isolated flag" 7 thereon is connected to a wire bonding strip 7-1, to apply a back voltage to an integrated circuit chip thereon.

An integrated circuit chip 8 is die bonded to the upper surface of isolated flag 7. Integrated circuit chip 8 needs to have sufficiently low power dissipation that its heat can be adequately conducted away from chip 8 through the glass epoxy substrate 5 to the lead frame flag 3. Various bonding pads on integrated circuit chip 8 are wire bonded by means of gold bonding wires to various individual interconnects on glass epoxy substrate 5 or directly to the fingers of lead frame 2. For example, bonding pad 9-1 is connected by gold bonding wire 16-5 to gold plated interconnect 6-1, which in turn is bonded by gold wire 16-1 to lead frame finger 2-1. Similarly, bonding pad 9-2 is bonded by a gold bonding wire to interconnect 6-2. Interconnect 6-2 is connected by gold bonding wire 16-2 to lead frame finger 2-2.

In accordance with the present invention, glass epoxy substrate 5 has one or more rectangular "cutouts" which expose a silver plated upper surface of lead frame flag 3. In FIG. 1, the rectangular cutout bounded by edges 15-1 and 15-2 of glass epoxy substrate 5 exposes rectangular area 3A of lead frame flag 3.

Another integrated circuit chip 13 is directly die bonded to the exposed surface area 3A of lead frame flag 3. Ordinarily, chip 13 might dissipate much more power than integrated circuit chip 8, and therefore needs direct, low thermal resistance contact with the lead frame flag 3A in order to remove dissipated heat at an adequate rate to prevent excessive temperature buildup in integrated circuit chip 13. Various bonding pads 14-1, 14-3, etc., of integrated circuit chip 13 are wire bonded, using gold bonding wires, to various individual interconnects such as 12-1 and 11-1. Also, some bonding pads such as 14-2 of chip 13 are wire bonded directly to lead frame fingers such as 2-7.

In FIG. 1, which is drawn essentially to scale, chip 8 is a very low power 80 mil by 140 mil CMOS chip, and integrated circuit chip 13 is a relatively high power bipolar 86 mil by 140 mil chip. 1.0 to 1.3 mil gold wire bonds are utilized. The conductive gold plated strips such as 6-1, 6-2, etc., and 11-1 and gold plated flag 7 are one ounce (1.4 mil) 25 micron minimum gold plated copper. The upper surface of the lead frame flag 3 is silver plated and the lead frame fingers also are plated with silver. The lead frame is 10 mils thick.

After all of the wire bonds have been completed, plastic encapsulation 22, shown in FIG. 4, is provided using a conventional transfer molding process. The gold bonding wires are sufficiently ductile and sufficiently short that they reliably resist forces produced thereon by flow of the melted plastic during the transfer molding process.

The matrix of lead frames shown in FIG. 2 is entirely conventional, and need not be described further. In FIG. 3, the flexible glass epoxy "tape" in ribbon 20 has a plurality of sprocket holes 20-1 along the edges, so "tape" 20 can be formed into a roll and advanced by a sprocketed spool in an automated process. The tape 20 is entirely formed of the copper clad glass epoxy material referred to above, and the individual glass epoxy insulative substrates 5 are punched out of the tape. Although not shown in FIG. 3, the pattern of individual gold plated strips 6-1, 6-2, gold plated flag 7, and the gold plated strips 12-1, etc., is repeated on each of the insulative substrates 5. The outline of each of insulative substrates 5 in FIG. 3 indicates the lines along which a conventional punch machine separates those insulative substrates 5 from the film 20, severing the shorting bars 17-1 in FIG. 1.

Numerals 20-2 designate 3 vertical elongated gold plated "plating busses". A plurality of the horizontal lines such as 20-3 interconnect the vertical plating busses. All of the interconnects on the upper surface of insulative substrates 5 are connected by shorting bars 17-1 to the plating bus composed of lines 20-2 and lines 20-3 in FIG. 3 until they are severed as the individual insulative substrates are punched out of the film tape 20. This structure allows the plating bus to be easily connected to a suitable electric potential to effectuate electric plating of gold onto all of the copper foil pattern initially etched on the copper foil backed surface of the glass epoxy film 20.

Although the insulative substrate 5 in the above described embodiment of the invention is L-shaped, the cutouts can be within the insulative substrate 5, as shown in the section of film 20 at the top of FIG. 3, wherein several rectangular cutouts 15A and 15B are provided in each of the insulative substrates 5A to be punched out of the film 20. Round cutouts also could be punched into the insulative substrates to allow wire bonding to the lead frame flag, if desired. The cutouts 15A and 15B expose areas of the lead frame flag 3 large enough to allow components such as integrated circuit chips or other components to be directly die bonded to the exposed surface of lead frame flag 3.

It should be appreciated that in some instances, where the substrates of various integrated circuit chips may need to be maintained at different voltages, it may be desirable to attach low power chips to the conductive flags such as 7 on the insulative substrates 5 and attach other low power chips directly to the exposed areas of the lead frame flag 3, thereby avoiding difficult routing of power supply busses on the upper surface of the insulative substrates 5.

While the invention has been described with reference to a particular embodiment thereof, those skilled in the art will be able to make various modifications to the described embodiment without departing from the true spirit and scope thereof. For example, multilayer metalization may be provided on the glass epoxy substrate. Of course, high or low power discrete and/or integrated chips manufactured using various technologies can be die bonded to metal flags such as 7 on the insulative film and/or to exposed areas of the lead frame flag. The lead frame may be split into several separate lead frame flags, each electrically connected to a different lead frame finger, to allow different back voltages to be applied to separate chips respectively die bonded thereto.

What is claimed is:

1. A method of making a hybrid integrated circuit, comprising the steps of:
    (a) forming a metal layer pattern on a surface of an insulative film, the metal layer pattern including a plurality of individual bonding strips, a flag area, and a plating bus connected to the bonding strips and the flag area;
    (b) electroplating a metal coating onto the metal layer pattern while applying an electroplating voltage to the plating bus;
    (c) punching a piece out of the insulative film so as to produce a cutout larger than a first integrated circuit chip and so that the piece contains the bonding strips and the flag area and no interconnected parts of the plating bus are on the piece;
    (d) attaching the piece to a first area of a flag of a lead frame to partially cover the flag of the lead frame while leaving uncovered a second area of the flag of the lead frame, the second area being exposed through the cutout, the lead frame having a plurality of fingers;
    (e) die bonding the first integrated circuit chip to the second area of the flag of the lead frame, and die bonding a second integrated circuit to the flag area;
    (f) wire bonding each of a plurality of bonding pads of the first and second integrated circuit chips to various bonding strips, respectively, and wire bonding some of the bonding strips to various fingers of the lead frame, respectively, and wire bonding each of the bonding strips located along an edge of the cutout to both a bonding pad on the first integrated circuit chip and to a corresponding bonding pad on the second integrated circuit chip, respectively, the first integrated circuit being a relatively high power dissipation integrated circuit, and the second integrated circuit being a relatively low power dissipation integrated circuit; and (g) filling a volume containing the bonding wires, the first and second integrated circuit chips, and the flag and fingers of the lead frame with plastic to plastic-encapsulate the hybrid integrated circuit.

2. A method of making a hybrid integrated circuit, comprising the steps of:
 (a) forming a metal layer pattern on a surface of an insulative film, the metal layer pattern including a plurality of individual bonding strips, a flag area, and a plating bus connected to the bonding strips and the flag area, the insulative film being in the form of an elongated ribbon having therein first and second groups of sprocket receiving holes located along opposed edges of portions of the insulative film, respectively;
 (b) electroplating a metal coating onto the metal layer pattern while applying an electroplating voltage to the plating bus;
 (c) punching a piece out of the insulative film so as to produce a cutout larger than a first integrated circuit chip and so that the piece contains the bonding strips and the flag area and no interconnected parts of the plating bus are on the piece;
 (d) advancing the insulative film by means of a sprocketed spool and the sprocket receiving holes to align a portion of the insulative film with a punch;
 (e) attaching the piece to a first area of a flag of a lead frame to partially cover the flag of the lead frame while leaving uncovered a second area of the flag of the lead frame, the second area being exposed through the cutout, the lead frame having a plurality of fingers;
 (f) die bonding the first integrated circuit chip to the second area of the flag of the lead frame, and die bonding a second integrated circuit to the flag area;
 (g) wire bonding each of a plurality of bonding pads of the first and second integrated circuit chips to various bonding strips, respectively, and wire bonding some of the bonding strips to various fingers of the lead frame, respectively, and wire bonding each of the bonding strips located along an edge of the cutout to both a bonding pad on the first integrated circuit chip and to a corresponding bonding pad on the second integrated circuit chip, respectively, the first integrated circuit being a relatively high power dissipation integrated circuit, and the second integrated circuit being a relatively low power dissipation integrated circuit; and
 (h) filling a volume containing the bonding wires, the first integrated circuit chip, and the flag and fingers of the lead frame with plastic to plastic-encapsulate the hybrid integrated circuit.

* * * * *